United States Patent
Beck et al.

(10) Patent No.: US 7,894,240 B2
(45) Date of Patent: Feb. 22, 2011

(54) METHOD AND APPARATUS FOR REDUCING CHARGE TRAPPING IN HIGH-K DIELECTRIC MATERIAL

(75) Inventors: Michael Beck, Dresden (DE); Martin Kerber, Munich (DE); Peter Lahnor, Dresden (DE); Roland Thewes, Groebenzell (DE)

(73) Assignee: Qimonda AG, München (DE)

( * ) Notice: Subject to any disclaimer, the term of this patent is extended or adjusted under 35 U.S.C. 154(b) by 351 days.

(21) Appl. No.: 12/201,223

(22) Filed: Aug. 29, 2008

(65) Prior Publication Data
US 2010/0054022 A1    Mar. 4, 2010

(51) Int. Cl.
G11C 11/24    (2006.01)
(52) U.S. Cl. .................... 365/149; 365/189.12; 365/222
(58) Field of Classification Search .................. 365/149, 365/189.12, 222
See application file for complete search history.

(56) References Cited

U.S. PATENT DOCUMENTS

| 4,164,667 | A | * | 8/1979 | Akamatsu .................... 327/475 |
| 2005/0169040 | A1 | * | 8/2005 | Peng et al. .................. 365/149 |
| 2007/0235786 | A1 | | 10/2007 | Kapteyn et al. | |

* cited by examiner

Primary Examiner—Son Dinh
(74) Attorney, Agent, or Firm—Coats & Bennett PLLC

(57) ABSTRACT

In one embodiment, an integrated circuit includes a memory array having a plurality of capacitors for storing data of an initial state in the memory array in an initial state. The integrated circuit also includes circuitry for occasionally inverting the data stored by the plurality of capacitors and tracking whether the current state of the data stored by the plurality of capacitors corresponds to the initial state. The circuitry inverts the data read out of the memory array during a read operation when the current state of the data does not correspond to the initial state.

29 Claims, 8 Drawing Sheets

METHOD AND APPARATUS FOR REDUCING CHARGE TRAPPING IN HIGH-K DIELECTRIC MATERIAL

BACKGROUND

Integrated circuits include capacitors for a wide variety of uses, including filtering, storing information, power conditioning, tuning, etc. Memory devices such as Dynamic Random Access Memory (DRAM) and embedded-DRAM store bits of information in an array of memory cells formed from storage capacitors. Each storage capacitor is capable of storing one or more bits of information. A DRAM memory cell typically includes an access transistor coupled to a capacitor which can be buried in a semiconductor substrate (e.g., in a trench) or formed on the substrate surface. Information is written to the storage capacitor by activating the word line coupled to the gate of the access transistor. The storage capacitor is then either positively or negatively charged via the bit line of the cell to store the information. The information can be subsequently read out of the memory array by activating the word line and sensing the voltage level of the bit line.

Capacitor-based memory devices typically employ $SiO_2$ or other materials having a similar dielectric constant as the capacitor node dielectric. $SiO_2$ can be readily formed by oxidizing silicon, yielding a uniform and conformal oxide layer having high interface quality. However, the dielectric constant of $SiO_2$ is relatively low (approximately 3.9), thus limiting the storage capacity of the device. Low capacitor storage capacity becomes problematic for low-voltage, high-performance semiconductor technologies. Mainly, it is difficult to accurately sense a small amount of charge stored on a capacitor. High-k dielectric materials such as hafnium and zirconium silicates and oxides (e.g., HfSiON, $HfO_2$, HfSiO, HfSiON, etc.) and other materials or stacks of materials (e.g. $ZrO_2/SiO_2/ZrO_2$, $ZrO_2/Al_2O_3/ZrO_2$, etc.) having a relatively high dielectric permittivity can be used in place of $SiO_2$ as the capacitor dielectric film. Capacitors formed from high-k dielectric materials have a much higher charge storage capacity than their $SiO_2$ counterparts and thus can be sensed more reliably and can store the same amount of charge in a smaller area.

However, storing the same charge on a high-k dielectric capacitor for long periods of time subjects the capacitor to undesirable transient effects. These transient effects degrade the capability of the capacitor to subsequently store charge of the opposite state. That is, the capacitor weakly stores charge of a new state when charge of the opposite state was previously stored by the capacitor for a relatively long period of time.

For example, high-k dielectric materials are more susceptible to charge trapping and/or polarization effects than lower-k dielectric materials such as $SiO_2$. Electric dipoles tend to align in high-k material when an external electric field is applied to the capacitor electrodes. High-k materials are also subject to electronic trapping states in the band gap of the high-k material. When an electric field is applied for a sufficient time electrons tunnel from the capacitor electrodes into trapping states, creating charged states in the high-k dielectric material. The number and magnitude of electric dipoles that become aligned in the high-k material and the amount of electrons that tunnel into trapping states in the high-k dielectric material increase the longer a cell holds the same charge. In addition, the quality of the high-k dielectric material degrades more rapidly over time in the presence of aligned electric dipoles and trapping states.

SUMMARY

In one embodiment, an integrated circuit includes a memory array having a plurality of capacitors for storing data of an initial state written to the memory array. The integrated circuit also includes circuitry for occasionally inverting the data stored by the plurality of capacitors and tracking whether the current state of the data stored by the plurality of capacitors corresponds to the initial state. The circuitry inverts the data read out of the memory array during a read operation when the current state of the data does not correspond to the initial state.

Of course, the present invention is not limited to the above features and advantages. Those skilled in the art will recognize additional features and advantages upon reading the following detailed description, and upon viewing the accompanying drawings.

DETAILED DESCRIPTION

Figure 1:
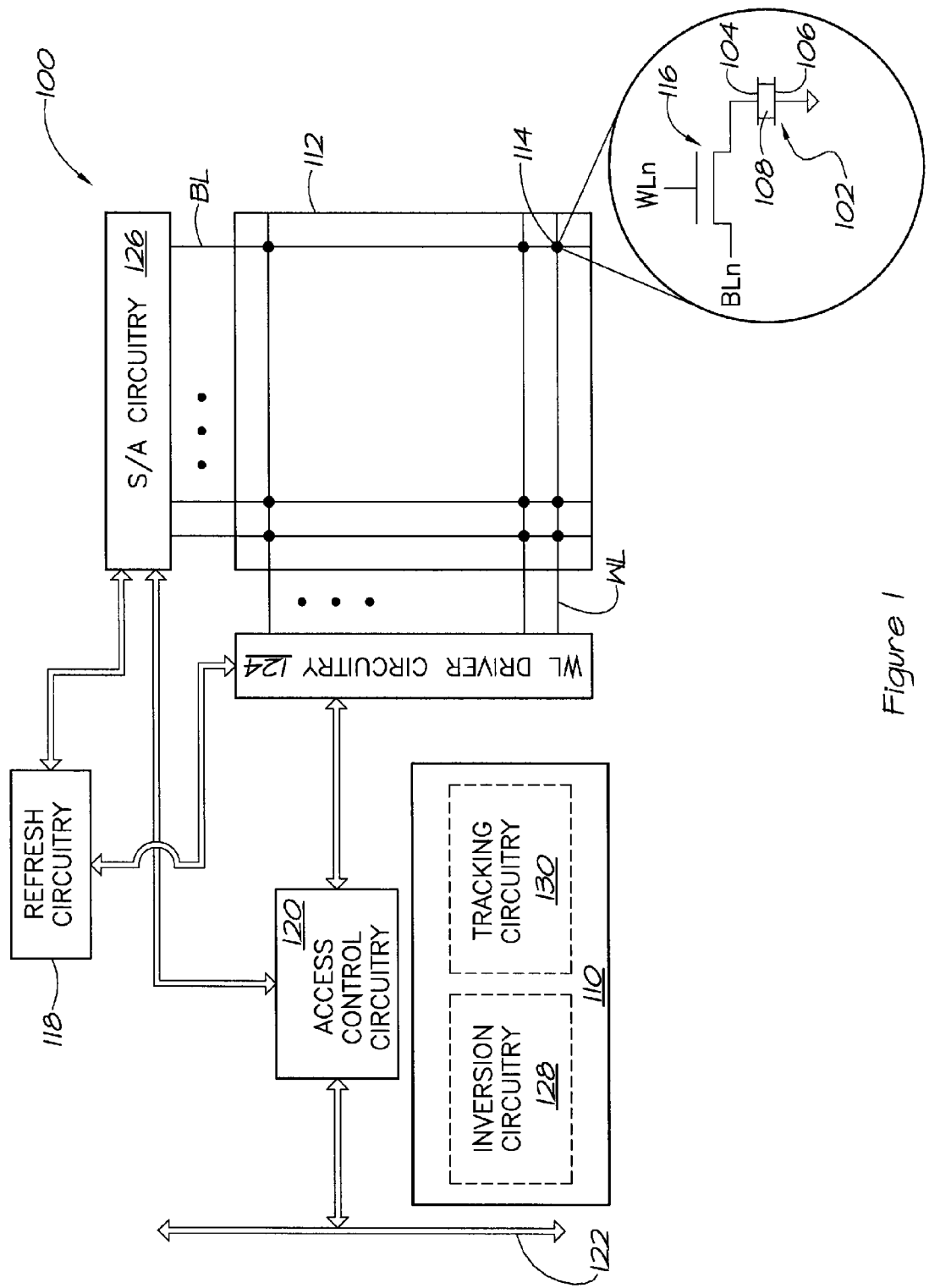
FIG. 1 is a block diagram of an embodiment of an integrated circuit having high-k dielectric capacitors.

FIG. 1 illustrates an embodiment of an integrated circuit 100 including a plurality of capacitors 102. Each capacitor 102 includes conductive plates 104, 106 separated by a high-k dielectric material 108. The high-k dielectric material may comprise any suitable high-k material such as hafnium and zirconium silicates and oxides (e.g., HfSiON, $HfO_2$, HfSiO, HfSiON, etc.) and other materials or stacks of materials (e.g. $ZrO_2/SiO_2/ZrO_2$, $ZrO_2/Al_2O_3/ZrO_2$, etc.) The capacitors 102 are semiconductor-based in that they are formed in or on a semiconductor substrate (not shown), e.g., in a trench, on the substrate surface or in one or more metal and/or insulating layers arranged on the substrate. The high-k dielectric material 108 is subject to polarization, charge trapping and other adverse transient effects. The integrated circuit 100 includes circuitry 110 for alleviating the adverse affects.

The circuitry 110 occasionally reverses the polarity of the charge stored on the capacitors 102. The term 'occasionally' as used herein broadly means frequently or infrequently occurring at irregular or regular time intervals. Occasionally reversing the stored charge drains out charges trapped in the high-k dielectric material 108, relaxes the electric dipoles and reduces other adverse transient effects. Occasionally reversing the stored charge so also reduces the amount of time available for increasing dipole orientation and charge trapping in the high-k dielectric material 108. When the charge polarity is reversed frequently enough, the next charge state is not overly weakened by adverse transient effects when the new state is opposite from the old state previously stored by the capacitor 102. Reducing charge trapping, polarization and other adverse transient effects in this way substantially prolongs the lifetime of the high-k dielectric material 108 by delaying the point at which dielectric breakdown occurs. Moreover, the circuitry 110 tracks whether the current polarity of the charge stored on each capacitor 102 corresponds to the initial polarity so that proper polarity is maintained during operation of the integrated circuit 100 for applications where data integrity is important, e.g., storage applications.

In one embodiment, the integrated circuit 100 is a memory device as shown in FIG. 1. According to this embodiment, the integrated circuit 100 includes a memory array 112 having a memory cell 114 located at the intersection of each word line (WL) and bit line (BL) of the array 112. Each memory cell 114 includes an access transistor 116 and a high-k dielectric storage capacitor 102. The capacitors 102 store charge at an initial polarity. Charge is stored by writing one or more bits of information of an initial state to the capacitor 102, e.g., by applying a positive voltage across the capacitor plates 104, 106 to store a logic '1' bit or a negative voltage to store a logic '0' bit. The integrated circuit 100 further includes refresh circuitry 118 for periodically refreshing data stored in the array 112 to prevent data loss and access control circuitry 120 for controlling read/write access to the array 112.

Figure 2:
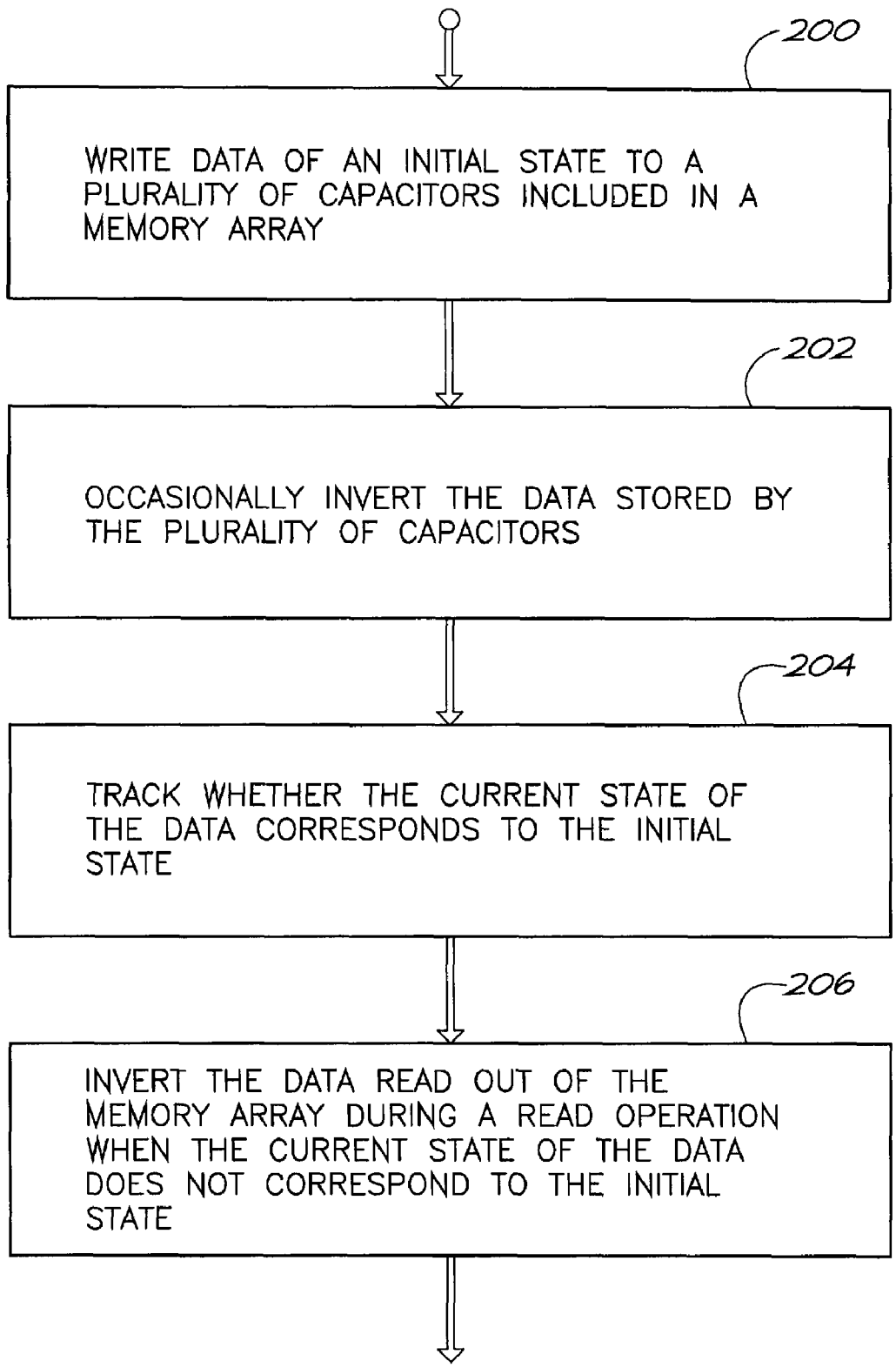
FIG. 2 is a flow diagram of an embodiment of a method for reducing charge trapping in a semiconductor-based capacitor.

During a write operation, data is transferred from an internal data bus 122 to the array 112 via the access control circuitry 120, e.g., as illustrated by Step 200 of FIG. 2. A particular cell 114 within the array 112 is selected by activating the corresponding WL and BL. The WL is activated by providing part of an address to word line driver circuitry 124 while the BL is activated by providing another part of the address to sense amplifier circuitry 126. The activated WL turns on the access transistor 116 of the desired cell 114, coupling the activated BL to a node of the desired storage capacitor 102. Data is then written to the selected cell 114 via the activated BL. Inversion circuitry 128 reduces polarization, charge trapping and other adverse transient effects that arise within the high-k dielectric material 108 of the storage capacitors 102 by occasionally inverting the data stored by the capacitors 102, e.g., as illustrated by Step 202 of FIG. 2. In one embodiment, the stored data is occasionally inverted during refresh operations, e.g., every refresh operation or a subset of refresh operations to reduce power consumption as will be described in more detail later herein. Occasionally inverting the stored data drains out trapped charges and relaxes electric dipoles that tend to build up when the same data is stored on the capacitors 102 for long periods of time. This in turn reduces the likelihood that a weakened state will be stored by the capacitors 102 when new data is subsequently written to the array 112.

The integrated circuit 100 also includes tracking circuitry 130 for determining whether the current state of the data stored by the capacitors 102 corresponds to the initial state of the data as originally stored in the array 112, e.g., as illustrated by Step 204 of FIG. 2. During a subsequent read operation to the same array location, the inversion circuitry 128 inverts the data read out of the memory array 112 when the current state of the data does not correspond to the initial state as indicated by the tracking circuitry 130, e.g., as illustrated by Step 206 of FIG. 2. This ensures that data integrity is properly maintained while reducing the adverse affects associated with polarization and charge trapping in the high-k dielectric material 108. The circuitry 110 for occasionally inverting stored data, tracking whether the current state of the data corresponds to the initial state and inverting the data when read out of the memory array 112 if inverted can be located centrally within the integrated circuit 100, dispersed throughout different components of the integrated circuit 100 or located externally.

Figure 3:
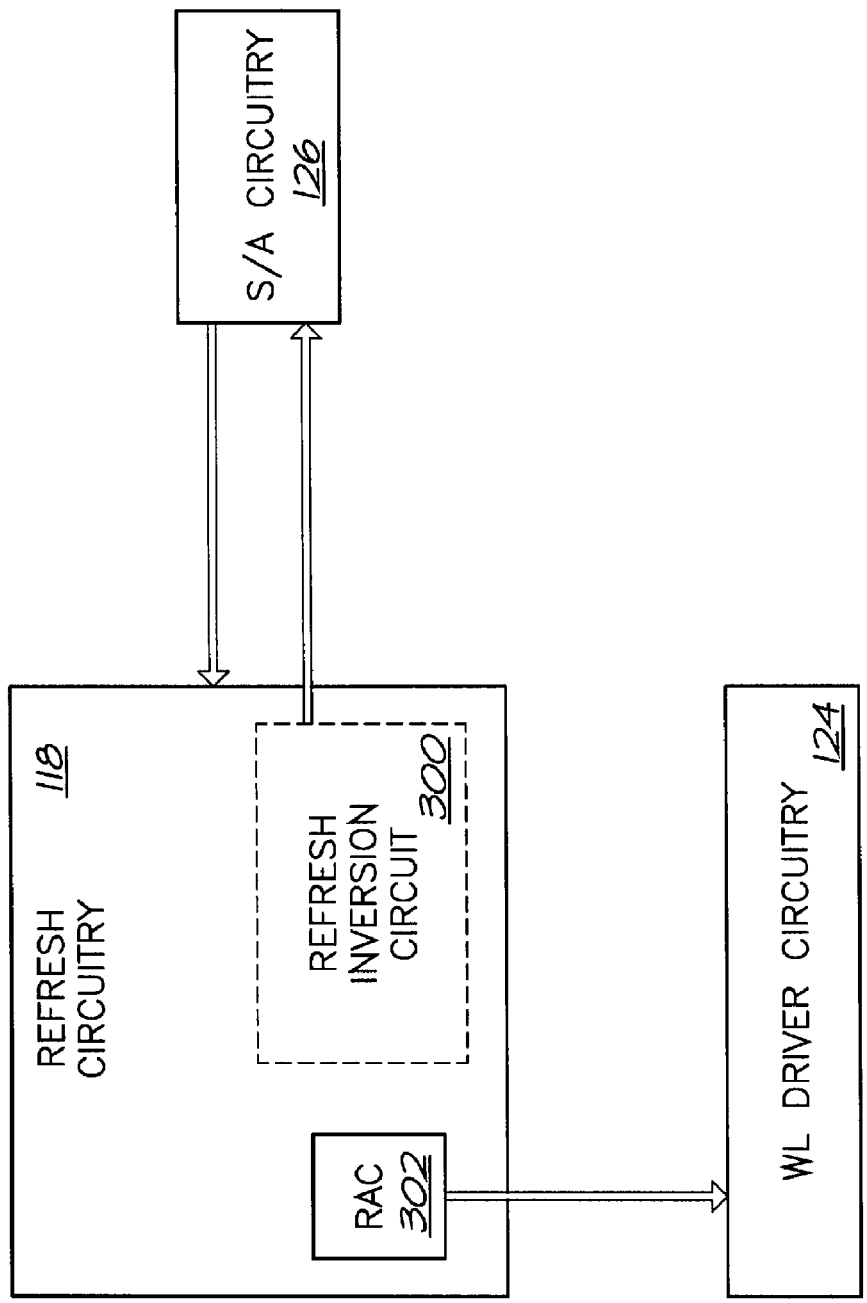
FIG. 3 is a block diagram of an embodiment of refresh circuitry included in a memory device having high-k dielectric storage capacitors.
Figure 4:
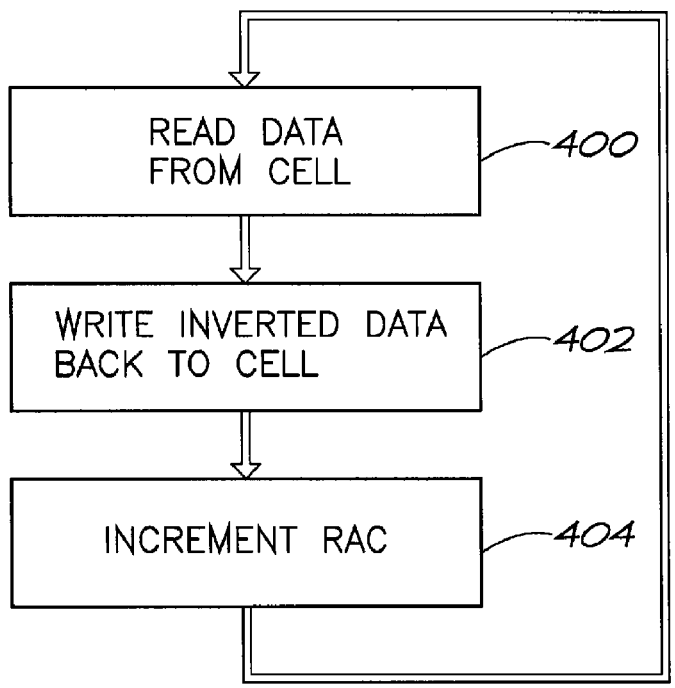
FIG. 4 is a flow diagram of an embodiment of a method for performing a refresh operation by a memory device having high-k dielectric storage capacitors.

FIG. 3 illustrates one embodiment the refresh circuitry 118 including a refresh inversion circuit 300 for occasionally inverting data stored in the array 112 during refresh operations. According to this embodiment, the refresh circuitry 118 also has a refresh address counter (RAC) 302 for storing the current refresh row address. The refresh row address determines the next row in the array 112 to be refreshed. The refresh row address is provided to the WL driver circuitry 124 for selecting a row in the array 112. The content of the selected row is then read from the array 112 and evaluated by the sense amplifier circuitry 126, e.g., as illustrated by Step 400 of FIG. 4. The refresh inversion circuit 300 inverts the sensed data and provides the inverted data back to the sense amplifier circuitry 126. In response, the sense amplifier circuitry 126 writes the inverted data back to the selected row, e.g., as illustrated by Step 402 of FIG. 4. The RAC 302 is incremented and the process repeated for the next row, e.g., as illustrated by Step 404 of FIG. 4. In one embodiment, a counter (not shown) determines the time between data inversions. This way, data inversion may be performed each refresh operation, every other refresh operation or any other suitable interval. In some cases, inverting the stored data during refresh may consume additional power. In these cases, the inversion interval can be extended to reduce power consumption. The inversion interval may be controlled by a signal from corresponding control circuitry on the integrated circuit or by an external signal. In another embodiment, data inversion is automatically performed during each refresh operation. In each embodiment, the tracking circuitry 130 monitors the activities of the inversion process to determine whether the current state of the information written to the selected capacitor 102 corresponds to the initial state.

Figure 6:
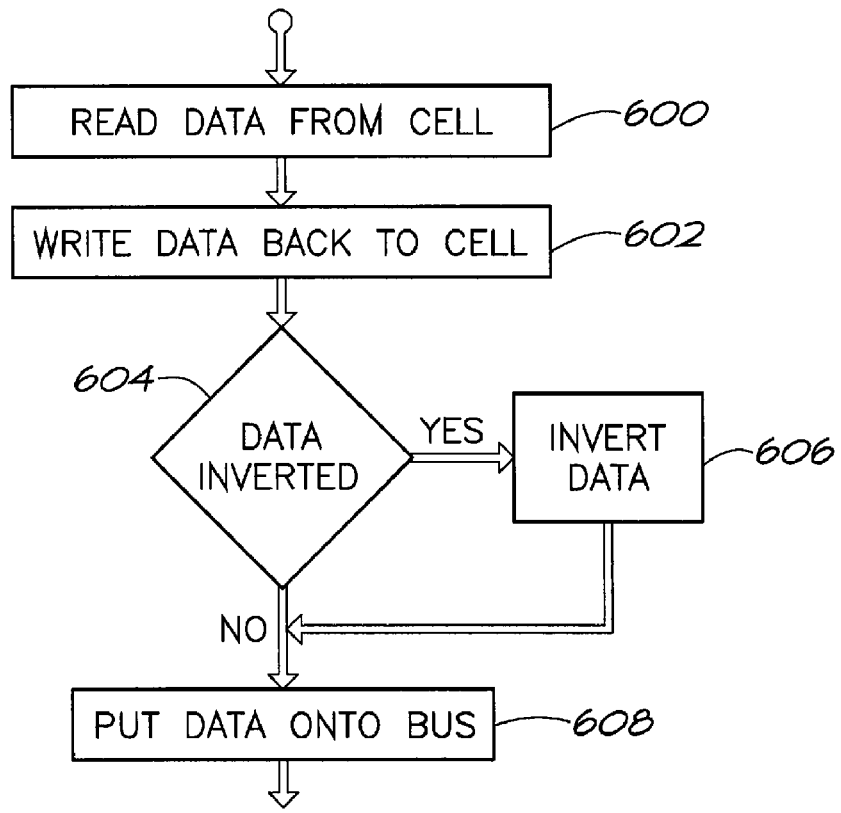
FIG. 6 is a flow diagram of an embodiment of a method for performing a read operation by a memory device having high-k dielectric storage capacitors.
Figure 5:
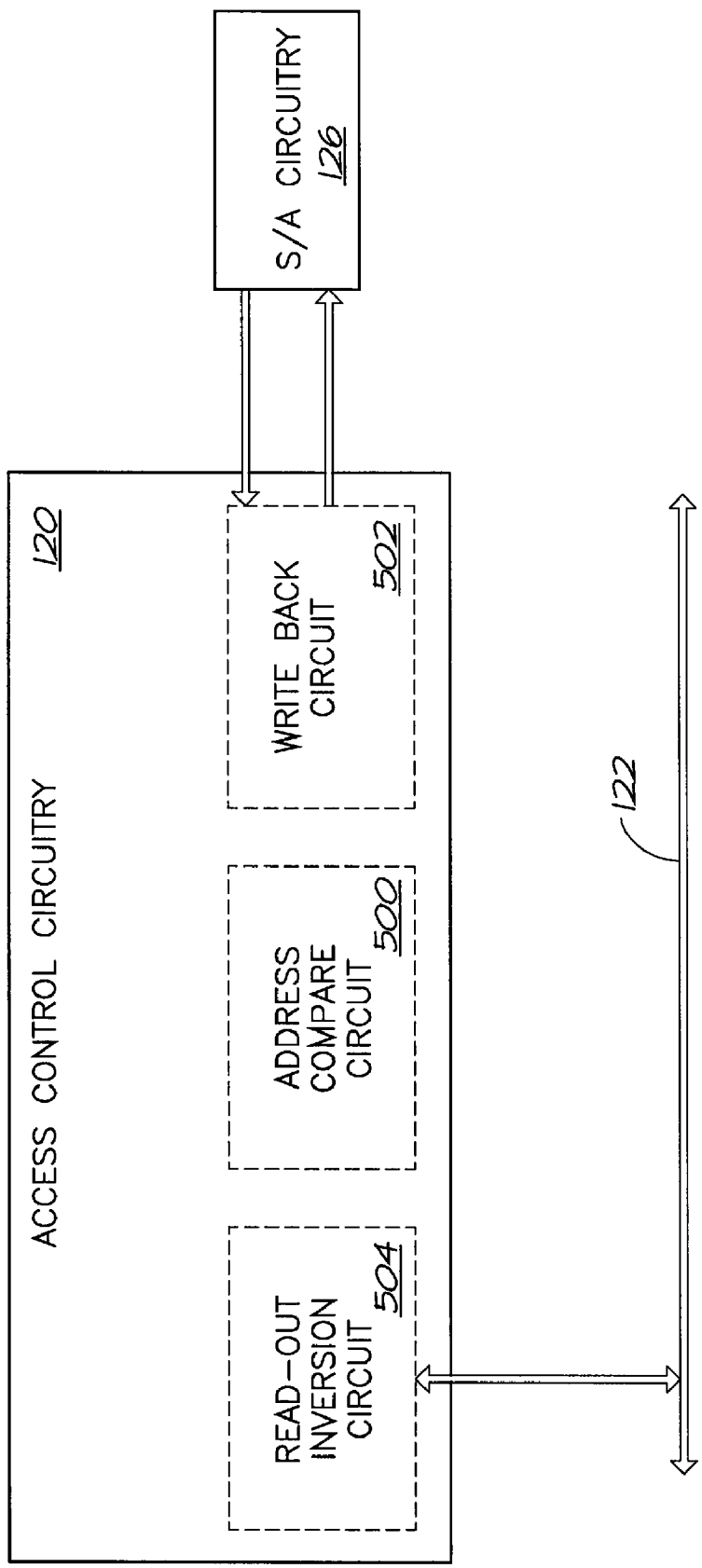
FIG. 5 is a block diagram of an embodiment of read/write access control circuitry included in a memory device having high-k dielectric storage capacitors.

FIG. 5 illustrates one embodiment of the access control circuitry 120 including an address compare circuit 500 for tracking whether the current state of the data stored by the capacitors 102 corresponds to the initial state. According to this embodiment, the access control circuitry 120 also includes a write back circuit 502 and a read-out inversion circuit 504. During a read operation, data is read from the selected cells 102 by the sense amplifier circuitry 126, e.g., as illustrated by Step 600 of FIG. 6. The write back circuit 502 provides the data to the sense amplifier circuitry 126 so that the data can be written back to the selected cells 102 when the read-out process is destructive, e.g., as illustrated by Step 602 of FIG. 6. The address compare circuit 500 determines whether the current state of the data read from the array 112 corresponds to its initial state, e.g., as illustrated by Step 604 of FIG. 6. If the data has been reversed from the initial state, the read-out inversion circuit 504 inverts the data and puts the inverted data on the internal data bus 122. This way, data integrity is maintained while reducing the adverse affects associated with charge trapping and polarization in the high-k dielectric material 108.

Figure 7:
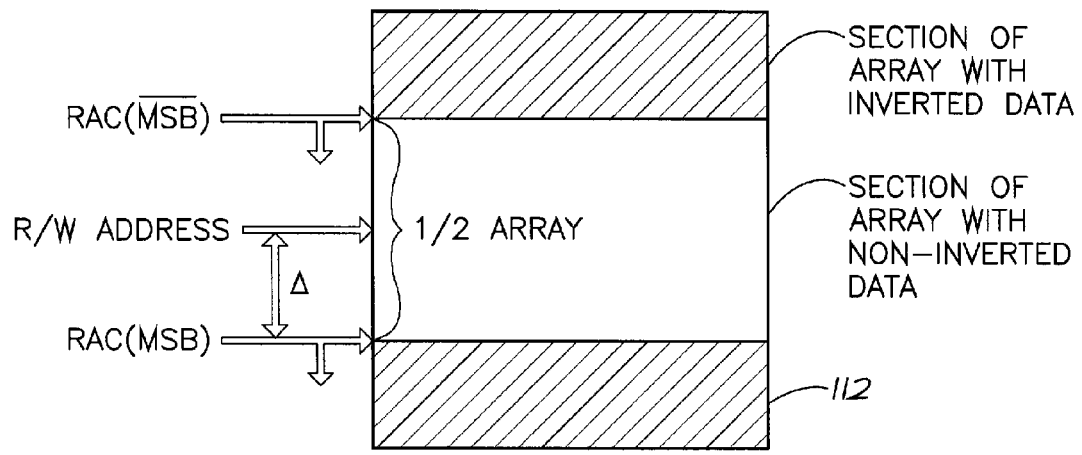
FIG. 7 is a block diagram of an embodiment of a segmented array included in a memory device having high-k dielectric storage capacitors.

FIG. 7 illustrates one embodiment of how the address compare circuit 500 determines whether data read from the array 112 during a read operation has been inverted from its initial state. The address compare circuit 500 compares the read address (RNV address) associated with the read operation to the current refresh row address stored in the RAC 302 of the refresh circuitry 118. If the difference between the two addresses is smaller than ½ of the total array length, then the row selected during the read operation contains non-inverted data as shown in FIG. 7. Otherwise, the selected row is located in a part of the array 112 that has been inverted. Appropriate action can then be taken to maintain data integrity, e.g., by inverting the data when the current state of the data does not correspond to the initial state. According to the embodiment shown in FIG. 7, the most significant bit (MSB) of the RAC 302 can be used to logically split the array 112 into two segments during refresh operations. This way, one row in the upper half of the array 112 can be refreshed followed by the same row in the lower half of the array by flipping the MSB of the current refresh row during a refresh cycle. The address compare circuit 500 compares the MSB of the read address to the MSB of the current refresh row address to determine whether data inversion has occurred.

Figure 8:
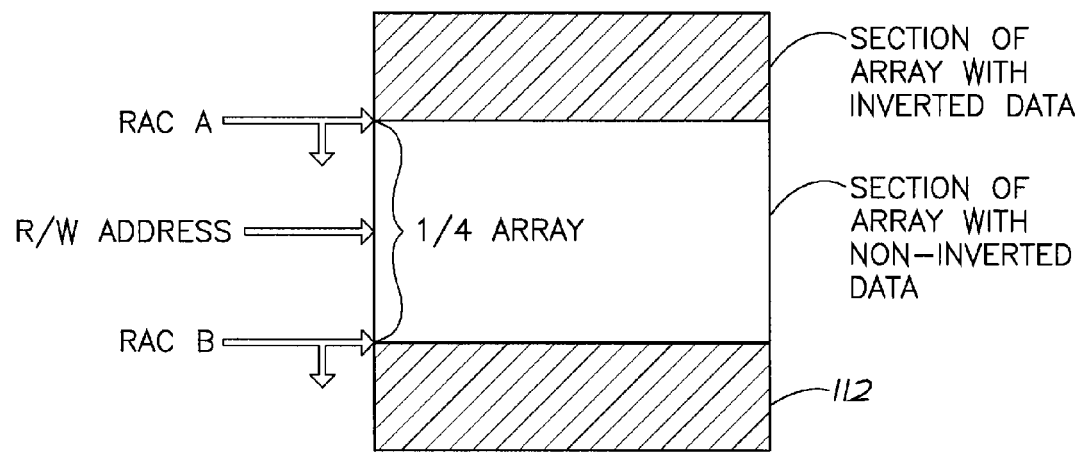
FIG. 8 is a block diagram of another embodiment of a segmented array included in a memory device having high-k dielectric storage capacitors.

FIG. 8 illustrates another embodiment of how the address compare circuit 500 determines whether data read out of the array 112 during a read operation has been inverted from its initial state. According to this embodiment, two different RACs 302 (labeled A and B in FIG. 8) are used by the refresh circuitry 118. As such, the array 112 can be logically split into one-quarter length segments. Additional RACs 302 can be provided for logically splitting the array 112 into even smaller segments during refresh operations. Broadly, the array 112 can be logically spilt into 1/n sized segments by using an appropriate number of RACs 302. The address compare circuit 500 compares the read address to the current refresh row address stored in each of the RACs 302. If the address difference is smaller than 1/n of the array length, then the row selected during the read operation contains non-inverted data as shown in FIG. 8. Otherwise, the data has been inverted from its initial state and is inverted as part of the read operation to maintain data integrity. The circuitry 110 for occasionally inverting stored data, tracking whether the current state of the data corresponds to the initial state and inverting the data when read out of the memory array 112 if inverted can be located in other parts of the integrated circuit 100.

Figure 9:
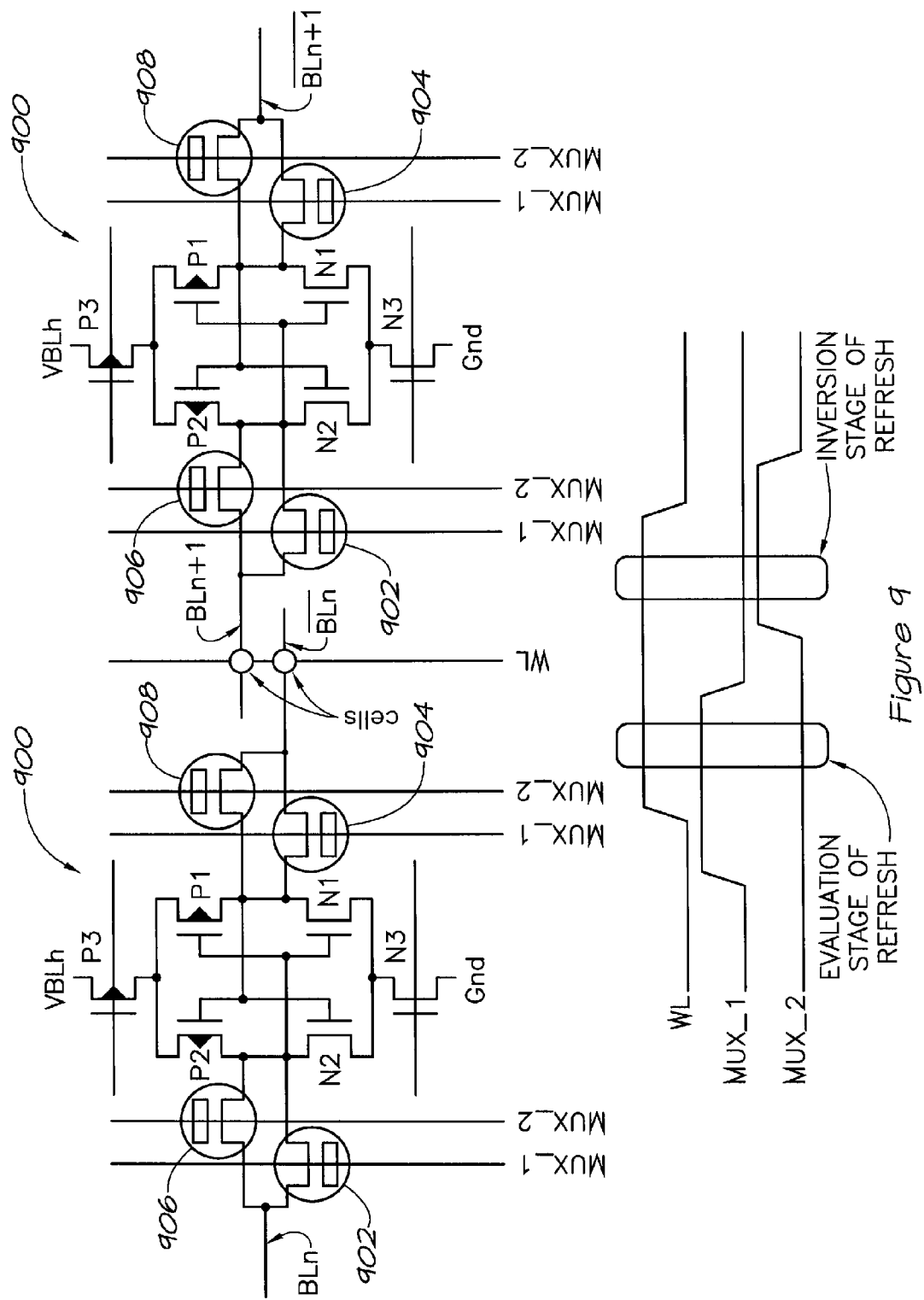
FIG. 9 is a circuit schematic and corresponding timing diagram of an embodiment of sense amplifier circuitry included in a memory device having high-k dielectric storage capacitors.

FIG. 9 illustrates an embodiment of sense amplifiers 900 included in the sense amplifier circuitry 126 for occasionally inverting data read from the array 112 during refresh operations. Each sense amplifier 900 includes a pair of cross-coupled inverters P1/N1 and P2/N2, a p-FET header device P3 and an n-FET footer device N3. Cross-coupled inverter P2/N2 is coupled to a BL while inverter P1/N1 is coupled to the complimentary BL ($\overline{BL}$). The p-FET header device P3 is coupled to a power supply (VBLh) and the n-FET footer device N3 is coupled to ground. Each sense amplifier 900 further includes a first group of one or more switch devices 902, 904 and a second group of one or more switch devices 906, 908. The first group of switch devices 902, 904 is controlled by a first signal (MUX_1) and enables BL sensing during an evaluation stage of a refresh operation. The second group of switch devices 906, 908 is controlled by a second signal (MUX_2) and enables BL inversion during an inversion stage of the refresh operation.

In more detail, the first group of switches 902, 904 couples the BL and the corresponding complimentary BL to the pair of cross-coupled inverters P1/N1 and P2/N2, respectively, when MUX_1 is active as shown in FIG. 9. When the corresponding WL is activated, the header and footer devices P3 and N3 couple the selected sense amplifier 900 to power and ground, respectively. The selected sense amplifier 900 senses the state of the information read from the memory array 112 on the BL during the evaluation stage of the refresh operation, i.e., when MUX_2 is inactive and MUX_1 and WL are active. The sense amplifier 900 is also capable of inverting the sensed data during the evaluation stage (which may not be every refresh cycle to reduce power consumption). The MUX_1 signal is deactivated when the evaluation stage is complete. The MUX_2 signal is then activated when data inversion is to be performed during the refresh operation. In response, the second group of switches 906, 908 couples the inverted output of the pair of cross-coupled inverters P1/N1 and P2/N2 to the BL and corresponding complimentary BL, respectively. The inverted data is then written back to the appropriate cell 114 of the memory array 112.

Figure 10:
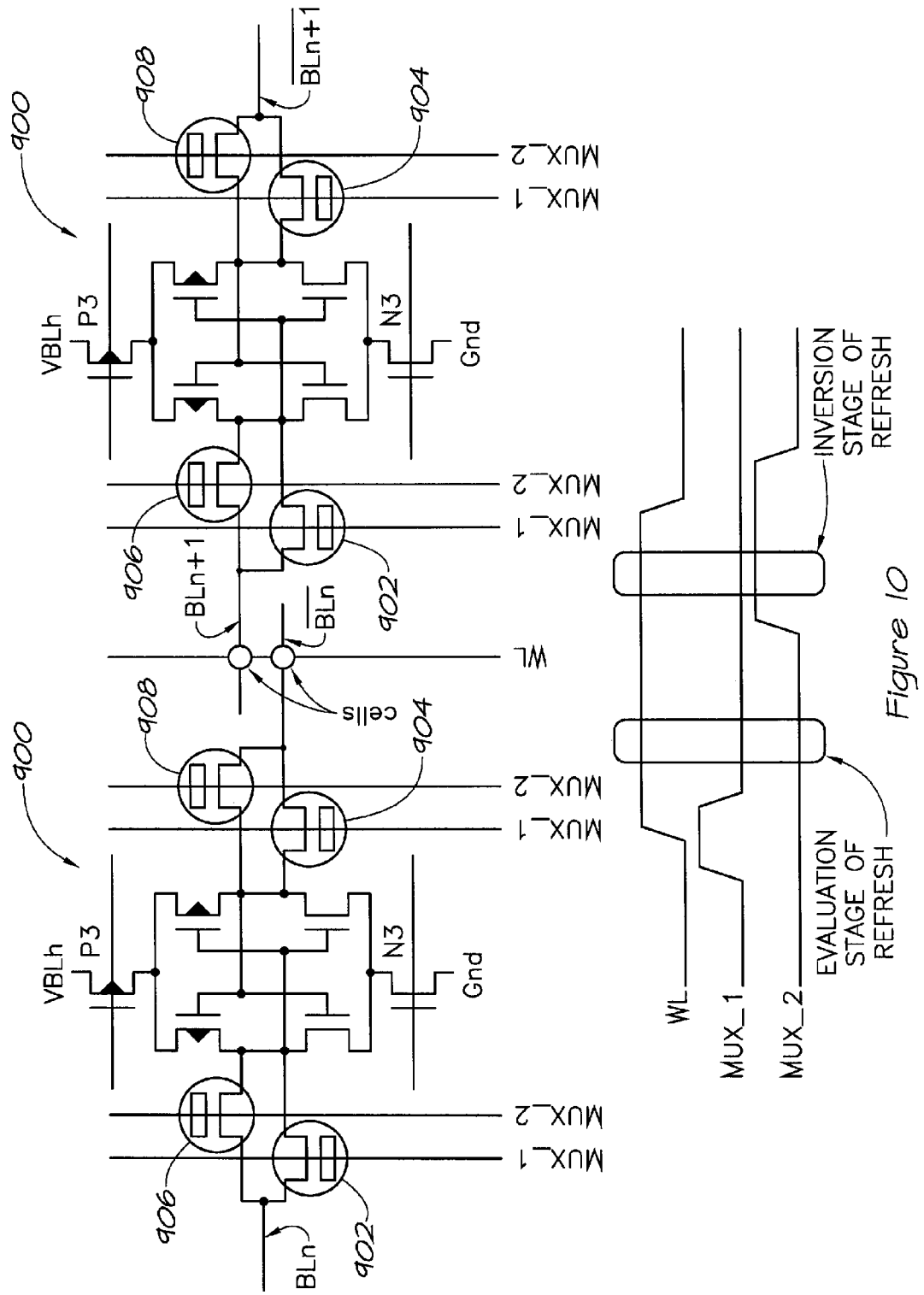
FIG. 10 is a circuit schematic and corresponding timing diagram of another embodiment of sense amplifier circuitry included in a memory device having high-k dielectric storage capacitors.

FIG. 10 illustrates another embodiment of operating the sense amplifiers 900 to occasionally invert data read-out of the array 112 during refresh operations. According to this embodiment, the pair of cross-coupled inverters P1/N1 and P2/N2 is isolated from the BL and corresponding complimentary BL during the evaluation stage of a refresh operation. To this end, MUX_1 is activated at the beginning of the refresh operation so that the pair of cross-coupled inverters P1/N1 and P2/N2 can sense the BL data. The MUX_1 signal is then deactivated, de-coupling the pair of cross-coupled inverters P1/N1 and P2/N2 from the BL and corresponding complimentary BL. The MUX_1 and MUX_2 signals remain deactivated during the evaluation stage of the refresh operation as shown in FIG. 10. This differs from the previous embodiment shown in FIG. 9 where the pair of cross-coupled inverters P1/N1 and P2/N2 remains coupled to the BL and corresponding complimentary BL during the evaluation stage. In either embodiment, the MUX_2 signal is activated during the inversion stage of the refresh operation, causing the inverted data to be driven onto the BL and corresponding complimentary BL and written back to the selected cell 114 in the array 112.

The tracking circuitry 130 then determines whether data subsequently retrieved from the memory array 112 during a read operation has been inverted from its initial state. If so, the data is changed back to the initial state to preserve data integrity. Several embodiments are discussed above for implementing the tracking circuitry 130 within the integrated circuit 100. In yet another embodiment, the tracking circuitry 130 can be implemented as a bit in a register (not shown) associated with each row of the memory array 112. The tracking bit is set each time the corresponding row is inverted from its initial state, e.g., during a refresh operation or other interval. The tracking bit is reset when the current state of the data corresponds to the initial state. The tracking bit can be maintained by the access control circuitry 120, the refresh circuitry 118 or other component of the integrated circuit 100. The tracking bit is examined during subsequent read operations to determine whether the row being accessed has been inverted or not. If inverted, the data read from the array 112 are reversed so that they match their original state, maintaining data integrity within the integrated circuit 100. In a further embodiment, data bit inversion may be tracked by determining a difference between the row being read and the content of one or more RACs 302. In other embodiments, data bit inversion can be tracked and maintained externally to the integrated circuit 100, e.g., by a memory controller, peripheral device, processor, etc.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of operating an integrated circuit with a semiconductor-based storage capacitor, comprising:
    storing charge of an initial polarity on the semiconductor-based capacitor;
    occasionally reversing the polarity of the charge stored on the semiconductor-based capacitor; and
    tracking whether the current polarity of the charge stored on the semiconductor-based capacitor corresponds to the initial polarity.

2. The method of claim 1, wherein the semiconductor-based capacitor comprises a storage element included in a memory array and wherein storing charge of an initial polarity on the semiconductor-based capacitor comprises writing information of an initial state to the semiconductor-based capacitor.

3. The method of claim 2, wherein occasionally reversing the polarity of the charge stored on the semiconductor-based capacitor comprises occasionally reversing the state of the information stored by the semiconductor-based capacitor during a period of time when the semiconductor-based capacitor is being refreshed.

4. The method of claim 2, wherein tracking whether the current polarity of the charge stored on the semiconductor-based capacitor corresponds to the initial polarity comprises tracking whether the current state of the information stored by the semiconductor-based capacitor corresponds to the initial state.

5. The method of claim 4, wherein tracking whether the current state of the information stored by the semiconductor-based capacitor corresponds to the initial state comprises:
    setting a register bit when the current state of the information does not correspond to the initial state; and
    resetting the register bit when the current state of the information corresponds to the initial state.

6. The method of claim 2, further comprising:
    reading the information out of the memory array during a read operation; and
    inverting the information when the current state of the information does not correspond to the initial state.

7. An integrated circuit, comprising:
    a semiconductor-based capacitor configured to store charge of an initial polarity; and
    circuitry configured to occasionally reverse the polarity of the charge stored on the semiconductor-based capacitor and track whether the current polarity of the charge stored on the semiconductor-based capacitor corresponds to the initial polarity.

8. The integrated circuit of claim 7, wherein the integrated circuit comprises a memory array including the semiconductor-based capacitor as a storage element and wherein the circuitry is configured to write information of an initial state to the semiconductor-based capacitor.

9. The integrated circuit of claim 8, wherein the circuitry is configured to occasionally reverse the state of the information stored by the semiconductor-based capacitor during a period of time when the semiconductor-based capacitor is being refreshed.

10. The integrated circuit of claim 8, wherein the circuitry is configured to track whether the current state of the information stored by the semiconductor-based capacitor corresponds to the initial state.

11. The integrated circuit of claim 10, wherein the circuitry is configured to set a register bit when the current state of the information does not correspond to the initial state and reset the register bit when the current state of the information corresponds to the initial state.

12. The integrated circuit of claim 8, wherein the circuitry is further configured to read the information out of the memory array during a read operation and invert the information when the current state of the information does not correspond to the initial state.

13. The integrated circuit of claim 7, wherein the semiconductor-based capacitor comprises a high-k dielectric material.

14. A method of storing data in an integrated circuit, comprising:
    writing data of an initial state to a plurality of capacitors included in a memory array;
    occasionally inverting the data stored by the plurality of capacitors;
    tracking whether the current state of the data stored by the plurality of capacitors corresponds to the initial state; and
    inverting the data read out of the memory array during a read operation when the current state of the data does not correspond to the initial state.

15. The method of claim 14, wherein occasionally inverting the data stored by the plurality of capacitors comprises:
    inverting the data when read out of the memory array during a refresh operation; and
    writing the inverted data back to the plurality of capacitors.

16. The method of claim 15, comprising:
    enabling sensing of the data during a first stage of the refresh operation; and
    enabling inversion of the data during a second stage of the refresh operation.

17. The method of claim 14, wherein tracking whether the current state of the data stored by the plurality of capacitors corresponds to the initial state comprises comparing a read address associated with the read operation to a current refresh row address.

18. The method of claim 17, wherein comparing a read address associated with the read operation to a current refresh row address comprises determining a difference between the read address and the current refresh row address.

19. The method of claim 14, wherein tracking whether the current state of the data stored by the plurality of capacitors corresponds to the initial state comprises:
    setting a register bit when the current state of the data does not correspond to the initial state; and
    resetting the register bit when the current state of the data corresponds to the initial state.

20. An integrated circuit, comprising:
    a memory array comprising a plurality of capacitors configured to store data of an initial state written to the memory array; and
    circuitry configured to occasionally invert the data stored by the plurality of capacitors, track whether the current state of the data stored by the plurality of capacitors corresponds to the initial state and invert the data read out of the memory array during a read operation when the current state of the data does not correspond to the initial state.

21. The integrated circuit of claim 20, wherein the circuitry is configured to invert the data when read out of the memory array during a refresh operation and write the inverted data back to the plurality of capacitors.

22. The integrated circuit of claim 21, wherein the circuitry comprises:
   a first group of one or more switch devices configured to enable sensing of the data during a first stage of the refresh operation; and
   a second group of one or more switch devices configured to enable inverting of the data during a second stage of the refresh operation.

23. The integrated circuit of claim 20, wherein the circuitry is configured to track whether the current state of the data stored by the plurality of capacitors corresponds to the initial state by comparing a read address associated with the read operation to a current refresh row address.

24. The integrated circuit of claim 23, wherein the circuitry is configured to determine a difference between the read address and the current refresh row address.

25. The integrated circuit of claim 20, wherein the circuitry is configured to set a register bit when the current state of the data does not correspond to the initial state and reset the register bit when the current state of the data corresponds to the initial state.

26. The integrated circuit of claim 20, wherein each of the capacitors comprises a high-k dielectric material.

27. The integrated circuit of claim 26, wherein the high-k dielectric material comprises hafnium silicate, hafnium oxide, zirconium silicate, zirconium oxide, HfSiON, $HfO_2$, HfSiO, HfSiON, $ZrO_2/SiO_2/ZrO_2$ or $ZrO_2/Al_2O_3/ZrO_2$.

28. The integrated circuit of claim 20, wherein the circuitry comprises a register configured to identify whether the data stored by the plurality of capacitors corresponds to the initial state.

29. The integrated circuit of claim 20, wherein the circuitry is configured to determine the time between data inversions based on a signal received by the circuitry.

* * * * *